United States Patent
Yakuwa et al.

(10) Patent No.: US 11,884,796 B2
(45) Date of Patent: *Jan. 30, 2024

(54) PLATE-LIKE COMPOSITE MATERIAL CONTAINING POLYTETRAFLUOROETHYLENE AND FILLER

(71) Applicants: NITTO DENKO CORPORATION, Ibaraki (JP); Tao Gu, Carlsbad, CA (US)

(72) Inventors: Shimpei Yakuwa, Ibaraki (JP); Kou Uemura, Ibaraki (JP); Shunji Imamura, Ibaraki (JP); Tomoyuki Kasagi, Ibaraki (JP); Tao Gu, Carlsbad, CA (US)

(73) Assignee: NITTO DENKO CORPORATION, Ibaraki (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/846,572

(22) Filed: Jun. 22, 2022

(65) Prior Publication Data

US 2022/0315739 A1    Oct. 6, 2022

Related U.S. Application Data

(62) Division of application No. 16/615,623, filed as application No. PCT/JP2018/020672 on May 30, 2018, now Pat. No. 11,453,762.

(60) Provisional application No. 62/619,562, filed on Jan. 19, 2018, provisional application No. 62/567,966, filed on Oct. 4, 2017, provisional application No. 62/560,432, filed on Sep. 19, 2017.

(30) Foreign Application Priority Data

May 31, 2017 (JP) ................................ 2017-108332

(51) Int. Cl.
*C08K 7/26* (2006.01)
*C08K 3/36* (2006.01)
*H05K 1/03* (2006.01)

(52) U.S. Cl.
CPC ............. *C08K 7/26* (2013.01); *C08K 3/36* (2013.01); *H05K 1/0373* (2013.01); *C08K 2201/002* (2013.01); *C08K 2201/003* (2013.01); *C08K 2201/006* (2013.01); *C08K 2201/011* (2013.01); *H05K 2201/015* (2013.01); *H05K 2201/0209* (2013.01)

(58) Field of Classification Search
CPC ..................................................... C08L 27/18
See application file for complete search history.

(56) References Cited

U.S. PATENT DOCUMENTS

| | | | |
|---|---|---|---|
| 3,915,916 | A | 10/1975 | Leverett |
| 4,370,436 | A | 1/1983 | Nakamura et al. |
| 5,055,342 | A | 10/1991 | Markovich et al. |
| 5,354,611 | A | 10/1994 | Arthur et al. |
| 5,506,049 | A | 4/1996 | Swei et al. |
| 5,607,744 | A | 3/1997 | Diener et al. |
| 2005/0123739 | A1 | 6/2005 | Chen-Yang et al. |
| 2007/0009727 | A1 | 1/2007 | Sawada et al. |
| 2014/0011954 | A1 | 1/2014 | Tokoro et al. |
| 2015/0307685 | A1 | 10/2015 | Pham |

FOREIGN PATENT DOCUMENTS

| | | |
|---|---|---|
| CN | 104479266 A | 4/2015 |
| CN | 106009428 A | 10/2016 |
| EP | 0604799 A1 | 7/1994 |
| JP | S57-18730 A | 1/1982 |
| JP | 3-212987 A | 9/1991 |
| JP | 6-88000 A | 3/1994 |
| JP | 6-119810 A | 4/1994 |
| JP | 8-157643 A | 6/1996 |
| JP | 2001-176329 A | 6/2001 |
| JP | 2001-358415 A | 12/2001 |
| JP | 2005-163006 A | 6/2005 |
| JP | 2015-209480 A | 11/2015 |
| WO | 2005/019320 A1 | 3/2005 |

OTHER PUBLICATIONS

International Search Report dated Aug. 14, 2018, issued in counterpart International Application No. PCT/JP2018/020672, with English Translation. (4 pages).
Notification of Transmittal of Translation of the International Preliminary Report on Patentability (Form PCT/IB/338) issued in counterpart International Patent Application No. PCT/2018/020672 dated Dec. 12, 2019, with forms PCT/IB/373 and PCT/ISA/237. (6 pages).
Extended European Search Report dated Feb. 9, 2021, issued in counterpart European Application No. 18810405.3 (In English ; 5 pages).
Chinese Office Action dated Mar. 3, 2021, issued in counterpart Chinese Application No. 201880035656.3 (15 pages ; w/English machine translation).
Office Action dated Oct. 5, 2021, issued in counterpart European Application No. 18810405.3 (in English; 4 pages).
Office Action dated Nov. 30, 2021, issued in counterpart Taiwanese Application No. 1071185360 (w/English translation; 12 pages).

*Primary Examiner* — Wenwen Cai
(74) *Attorney, Agent, or Firm* — WHDA, LLP

(57) ABSTRACT

Provided is a composite material that shows a low specific dielectric constant, and that hardly causes an appearance failure or changes in characteristics when exposed to, for example, a treatment liquid to be used in the production of an electronic circuit board. Specifically, a plate-like composite material including polytetrafluoroethylene and a predetermined filler, and satisfying a predetermined condition serves as a composite material that shows a low specific dielectric constant, and that hardly causes an appearance failure or changes in characteristics even when exposed to, for example, a treatment liquid to be used in the production of an electronic circuit board.

6 Claims, 1 Drawing Sheet

PLATE-LIKE COMPOSITE MATERIAL CONTAINING POLYTETRAFLUOROETHYLENE AND FILLER

This is a divisional application of U.S. application Ser. No. 16/615,623 filed on Nov. 21, 2019, which is a National Stage Application filed under 35 U.S.C. § 371 of International Application PCT/JP2018/020672 filed on May 30, 2018, which is based upon and claims the benefit of priority from the prior application of U.S. Provisional Application No. 62/560,432 filed Sep. 19, 2017, which is based upon and claims the benefit of priority from the prior application of U.S. Provisional Application No. 62/567,966 filed Oct. 4, 2017, which is based upon and claims the benefit of priority from the prior application of U.S. Provisional Application No. 62/619,562 filed Jan. 19, 2018 which is hereby incorporated by reference.

TECHNICAL FIELD

The present disclosure relates to a plate-like composite material suitable for an electronic circuit board or the like.

BACKGROUND ART

Due to advance of electronic technology, electronic devices, such as computers and mobile communication devices, each using the high frequency band are increasing. For a wiring board and a multilayer wiring board for high frequencies to be used for such electronic devices, a low specific dielectric constant is generally required, and nonpolar resin materials, such as polyethylene, polypropylene, polystyrene, and polytetrafluoroethylene, are utilized.

For example, a composite material obtained by blending a fluoropolymer matrix with hydrophobic coated hollow inorganic microspheres has been proposed as a wiring board material excellent in mechanical, thermal, and electrical properties (see PTL 1). In addition, a composite material obtained by blending boron nitride or the like into a fluoropolymer has been proposed as a printed wiring board material that has a small filler content and is easily subjected to drilling (see PTL 2).

RELATED ART DOCUMENT

Patent Document

PTL 1: JP-A-HEI06(1994)-119810
PTL 2: JP-A-HEI03(1991)-212987

SUMMARY

Various chemicals have been used in a production process for an electronic circuit board. However, for example, when the board or a material therefor is exposed to a treatment liquid having high permeability, the treatment liquid may permeate the inside of the board or the material to cause an appearance failure of the board or changes in characteristics thereof. In particular, further attention needs to be paid to a board that is blended with a large amount of a filler for improving its dimensional stability or strength, or that is increased in porosity for reducing its dielectric constant because the treatment liquid is liable to permeate the board.

That is, the present disclosure provides a composite material that shows a low specific dielectric constant, and that hardly causes an appearance failure or changes in characteristics when exposed to, for example, a treatment liquid to be used in the production of an electronic circuit board.

In order to achieve the object, the gist of the present disclosure includes the following items [1] to [5].

[1] A plate-like composite material, including:
  polytetrafluoroethylene; and
  a filler,
  wherein the filler contains porous inorganic fine particle aggregates each formed by aggregation of inorganic fine particles having an average primary particle diameter of from 5 nm to 200 nm,
  wherein the composite material has a porosity of 35% or more, and
  wherein the composite material has a critical liquid-repellent tension determined by the following wetting tension test of 34.0 mN/m or less:

[Wetting Tension Test]
  a test object is immersed in each of test mixtures, which correspond to test mixtures described in JIS K 6768: 1999 of Japan Industrial Standards, and which have wetting tensions at 23° C. of 22.6 mN/m, 25.4 mN/m, 27.3 mN/m, 30.0 mN/m, 31.0 mN/m, 32.0 mN/m, 33.0 mN/m, 34.0 mN/m, 35.0 mN/m, 36.0 mN/m, 37.0 mN/m, 38.0 mN/m, 39.0 mN/m, 40.0 mN/m, 41.0 mN/m, 42.0 mN/m, 43.0 mN/m, 44.0 mN/m, 45.0 mN/m, 46.0 mN/m, 48.0 mN/m, and 50.0 mN/m, at 25° C. for 1 minute to confirm whether or not each of the test mixtures permeates the test object, and a numerical value of a wetting tension of a test mixture having the smallest wetting tension out of the test mixtures that have not permeated the test object is determined to be a critical liquid-repellent tension of the test object.

[2] The composite material according to the above-mentioned item [1], wherein the filler has a BET specific surface area of from 30 $m^2/g$ to 240 $m^2/g$.
[3] The composite material according to the above-mentioned item [1] or [2], wherein a content of the filler is 40 parts by mass or more with respect to 100 parts by mass of a total of the polytetrafluoroethylene and the filler.
[4] The composite material according to any one of the above-mentioned items [1] to [3], wherein the filler has an apparent specific gravity of 100 g/L or less.
[5] The composite material according to any one of the above-mentioned items [1] to [4], wherein the composite material is used for an electronic circuit board.

According to the present disclosure, the composite material that shows a low specific dielectric constant, and that hardly causes an appearance failure or changes in characteristics when exposed to, for example, a treatment liquid to be used in the production of an electronic circuit board can be provided.

DESCRIPTION OF EMBODIMENTS

Embodiments of the present disclosure are hereinafter described in detail. The present disclosure is not limited to these embodiments.

Composite Material

A composite material according to one aspect of the present disclosure (hereinafter sometimes abbreviated as "composite material") is a plate-like composite material including polytetrafluoroethylene and a filler, wherein the filler contains porous inorganic fine particle aggregates each formed by the aggregation of inorganic fine particles having an average primary particle diameter of from 5 nm to 200 nm (hereinafter sometimes abbreviated as "inorganic fine particle aggregates"), wherein the composite material has a porosity of 35% or more, and wherein the composite material has a critical liquid-repellent tension determined by the following wetting tension test (hereinafter sometimes abbreviated as "critical liquid-repellent tension") of 34.0 mN/m or less.

[Wetting Tension Test]

A test object is immersed in each of test mixtures, which correspond to test mixtures described in JIS K 6768:1999 of Japan Industrial Standards, and which have wetting tensions at 23° C. of 22.6 mN/m, 25.4 mN/m, 27.3 mN/m, 30.0 mN/m, 31.0 mN/m, 32.0 mN/m, 33.0 mN/m, 34.0 mN/m, 35.0 mN/m, 36.0 mN/m, 37.0 mN/m, 38.0 mN/m, 39.0 mN/m, 40.0 mN/m, 41.0 mN/m, 42.0 mN/m, 43.0 mN/m, 44.0 mN/m, 45.0 mN/m, 46.0 mN/m, 48.0 mN/m, and 50.0 mN/m, at 25° C. for 1 minute to confirm whether or not each of the test mixtures permeates the test object, and a numerical value of a wetting tension of a test mixture having the smallest wetting tension out of the test mixtures that have not permeated the test object is determined to be a critical liquid-repellent tension of the test object.

Figure 1:
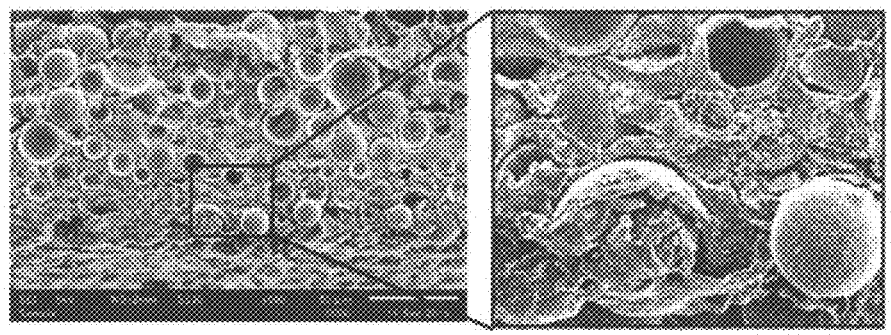
FIG. 1 is an image of a composite material including polytetrafluoroethylene and hollow inorganic fine particles (filler) taken with a scanning electron microscope (SEM) (photographs serving as alternatives to drawings).

The inventors have made investigations on plate-like materials suitable for an electronic circuit board and the like, in particular, dispersion strengthened composite materials each obtained by mixing a polymer material serving as a matrix with particles. In the course of the investigations, the inventors have confirmed that, when hollow inorganic fine particles are used as a filler like the composite material described in PTL 1, the hollow inorganic fine particles are broken in a production process for a composite material (see images taken with a scanning electron microscope (SEM) shown in FIG. 1), and hence their functions cannot be sufficiently exhibited in some cases. In addition, the inventors have revealed that, in the case where the inorganic fine particle aggregates are used as a filler, the aggregates are not broken even when subjected to treatment such as mixing, forming, or rolling, and hence characteristics such as a satisfactory specific dielectric constant and a satisfactory expansion coefficient can be secured.

In addition, the inventors have revealed the following new problem: when the board or a material therefor is exposed to a treatment liquid having high permeability as described in the foregoing, the treatment liquid permeates the inside of the board or the material to cause an appearance failure of the board or changes in characteristics thereof. In addition, the inventors have found that, when the critical liquid-repellent tension of the composite material is controlled to 34.0 mN/m or less by adjusting the surface composition, surface structure, or the like of the inorganic fine particle aggregates or the composite material, the composite material shows a low specific dielectric constant, and hardly causes an appearance failure or changes in characteristics even when exposed to, for example, a treatment liquid to be used in the production of an electronic circuit board.

The physical properties and characteristics of the "polytetrafluoroethylene", the "filler", and the "composite material", the form and structure of the "composite material", the applications of the "composite material", a method of producing the "composite material", and the like are described in detail below.

Polytetrafluoroethylene (PTFE)

Figures 2A, 2B:
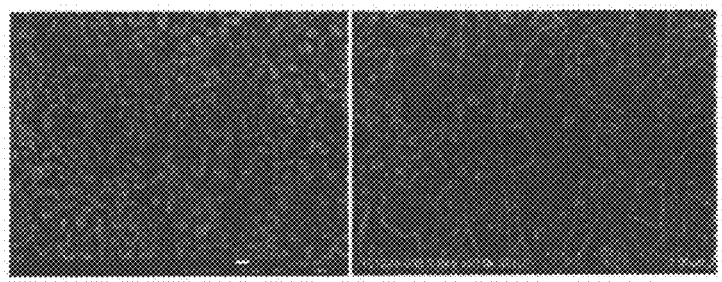
FIGS. 2A and 2B are images of a composite material according to one aspect of the present disclosure taken with a scanning electron microscope (SEM) (images in each of which a three-dimensional fine network structure is formed by polytetrafluoroethylene and porous inorganic fine particle aggregates each formed by the aggregation of inorganic fine particles having an average primary particle diameter of from 5 nm to 200 nm, in which FIG. 2A is a sectional image in a thickness direction (at a magnification of 50,000), and FIG. 2B is a sectional image in a surface direction (at a magnification of 50,000)) (photographs serving as alternatives to drawings).

The composite material is a plate-like material including the polytetrafluoroethylene and the filler, and the polytetrafluoroethylene in the composite material is preferably "fibrillated". Fibrils in the fibrillated polytetrafluoroethylene are more preferably oriented not only in one direction but also in a plurality of directions, and the fibrils and the inorganic fine particle aggregates to be described later are particularly preferably linked to each other to form a "three-dimensional fine network structure" as shown in images taken with a SEM shown in FIGS. 2A and 2B. When the polytetrafluoroethylene in the composite material is fibrillated, in particular, when the three-dimensional fine network structure is formed, the composite material can secure an excellent mechanical strength and excellent dimensional stability. The fibrillation or the like of the polytetrafluoroethylene may be confirmed through the observation of its surface with a SEM or the like. In addition, the fibrillation of the polytetrafluoroethylene, which may be advanced by, for example, applying a shear force, is more specifically performed through multi-stage rolling to be described later. In addition, the formation of the three-dimensional fine network structure is performed through, for example, directionally different multi-stage rolling to be described later.

Filler

Figure 3:
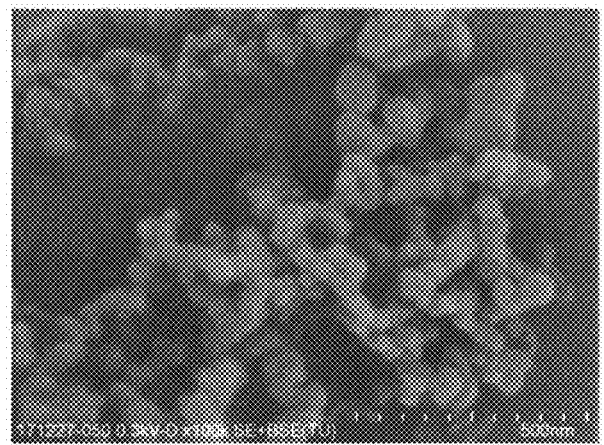
FIG. 3 is an image of a porous inorganic fine particle aggregate, which is formed by the aggregation of inorganic fine particles having an average primary particle diameter of from 5 nm to 200 nm, taken with a scanning electron microscope (SEM) (a photograph serving as an alternative to a drawing).

The composite material is a plate-like material including the polytetrafluoroethylene and the filler, and one feature thereof lies in that the filler contains the porous inorganic fine particle aggregates each formed by the aggregation of the inorganic fine particles having an average primary particle diameter of from 5 nm to 200 nm. Each of the porous inorganic fine particle aggregates is specifically such an aggregate as shown in an image taken with a SEM shown in FIG. 3, and means an aggregate that is formed by the fusion of a plurality of inorganic fine particles, and that has voids between the inorganic fine particles and is hence porous. The term "porous" of the porous inorganic fine particle aggregates as used herein means the voids between the inorganic fine particles forming the aggregates.

Examples of a material for the inorganic fine particles include: an oxide (including a composite oxide) of a typical element, such as silicon oxide (e.g., silicon monoxide or silicon dioxide (silica)) or aluminum oxide (alumina); an oxide (including a composite oxide) of a transition metal, such as titanium oxide (e.g., titanium dioxide (titania)), iron oxide, or zirconium oxide (zirconium dioxide (zirconia)); and a nitride of a typical element, such as boron nitride or silicon nitride. Those materials may be used alone or in combination thereof. Of those, an oxide of a typical element is preferred, and silicon dioxide (silica) is particularly preferred. The oxide of a typical element can suppress the specific dielectric constant of the composite material to an extremely low level, and enables the production of the composite material at lower cost. Although the crystallinity of the inorganic fine particles is not particularly limited, when silicon dioxide is used, the inorganic fine particles are typically amorphous.

The average primary particle diameter of the inorganic fine particles, which is from 5 nm to 200 nm, is preferably 10 nm or more, more preferably 15 nm or more, still more preferably 20 nm or more, and is preferably 150 nm or less, more preferably 120 nm or less, still more preferably 100 nm or less, particularly preferably 80 nm or less, most preferably 70 nm or less. In the case where the average primary particle diameter falls within the range, the inorganic fine particle aggregates are hardly broken even when subjected to treatment such as mixing, forming, or rolling, and hence satisfactory voids can be secured between the inorganic fine particles. In addition, the plate-like composite material easily secures a smooth surface. The average primary particle diameter of the inorganic fine particles is a numerical value obtained by: measuring the diameters of the particles through their observation with a SEM; and averaging the measured values. A specific procedure therefor is as follows: the inorganic fine particles (100 fine particles) are randomly selected, and their respective particle diameters (the lengths of the long sides of the particles) are measured, followed by the averaging of the resultant particle diameters to provide the numerical value.

The average particle diameter of the primary aggregate products of the inorganic fine particles is typically 100 nm or more, preferably 120 nm or more, more preferably 150 nm or more, and is typically 400 nm or less, preferably 380 nm or less, more preferably 350 nm or less.

The average particle diameter of the secondary aggregate products (aggregate products of the primary aggregate products) of the inorganic fine particles is typically 0.1 µm or more, preferably 1 µm or more, more preferably 2 µm or more, and is typically 100 µm or less, preferably 90 µm or less, more preferably 80 µm or less.

The inorganic fine particle aggregates in the composite material are each preferably in a state of a secondary aggregate product. When the aggregates are each in a state of a secondary aggregate product, the three-dimensional fine network structure is easily formed.

In addition, the average particle diameter of the primary aggregate products of the inorganic fine particles and the average particle diameter of the secondary aggregate products of the inorganic fine particles may each be calculated by the same method as that for the average primary particle diameter of the inorganic fine particles described in the foregoing.

The BET specific surface area of the inorganic fine particle aggregates is typically 10 m$^2$/g or more, preferably 20 m$^2$/g or more, more preferably 30 m$^2$/g or more, still more preferably 40 m$^2$/g or more, and is typically 250 m$^2$/g or less, preferably 240 m$^2$/g or less, more preferably 210 m$^2$/g or less, still more preferably 150 m$^2$/g or less, particularly preferably 80 m$^2$/g or less. When the BET specific surface area falls within the range, the composite material can secure a high porosity, and an increase in loss tangent thereof can be suppressed. In particular, when the BET specific surface area is excessively high, the loss tangent of the composite material tends to increase. The BET specific surface area of the inorganic fine particle aggregates is a numerical value calculated by substituting, for example, a gas adsorption amount measured by a gas adsorption method (in particular, a nitrogen adsorption isotherm) into a BET equation, and is represented by a numerical value before the use of the aggregates in the production of the composite material.

The apparent specific gravity of the inorganic fine particle aggregates is typically 10 g/L or more, preferably 20 g/L or more, more preferably 30 g/L or more, still more preferably 40 g/L or more, and is typically 100 g/L or less, preferably 90 g/L or less, more preferably 80 g/L or less, still more preferably 70 g/L or less, particularly preferably 60 g/L or less. When the apparent specific gravity falls within the range, the composite material can secure a high porosity, and the inorganic fine particle aggregates are hardly broken. The apparent specific gravity of the inorganic fine particle aggregates is a numerical value obtained by: loading the inorganic fine particle aggregates into a container that can measure a volume, such as a 250-milliliter measuring cylinder; measuring the loaded mass (X g) and loaded volume (Y mL) of the inorganic fine particle aggregates; and dividing the loaded mass by the loaded volume ([apparent specific gravity (g/L)]=X/Y×1000").

Examples of the inorganic fine particle aggregates include MIZUKASIL series (manufactured by Mizusawa Industrial Chemicals, Ltd.), SILYSIA series (manufactured by Fuji Silysia Chemical Ltd.), hydrophobic AEROSIL series (manufactured by Nippon Aerosil Co., Ltd.), and Nipsil series (manufactured by Tosoh Silica Corporation). Of those, hydrophobic fumed silica of hydrophobic AEROSIL series (manufactured by Nippon Aerosil Co., Ltd.) is particularly preferred.

Although the filler may contain a substance except the inorganic fine particle aggregates, the content of the inorganic fine particle aggregates in the entirety of the filler is typically 60 mass % or more, preferably 70 mass % or more, more preferably 80 mass % or more, still more preferably 90 mass % or more, particularly preferably 100 mass %. When the content falls within the range, the composite material can secure a high porosity, and the inorganic fine particle aggregates are hardly broken.

Examples of the filler except the inorganic fine particle aggregates include a granular filler and a fibrous filler. Examples of the granular filler include: solid carbon, such as carbon black; silicon dioxide (silica), such as molten silica or silica gel; an oxide (including a composite oxide) of a transition metal, such as titanium oxide (e.g., titanium dioxide (titania)), iron oxide, or zirconium oxide (zirconium dioxide (zirconia)); and a nitride of a typical element, such as boron nitride or silicon nitride. Examples of the fibrous filler include glass fiber and carbon fiber. Those fillers may be used alone or in combination thereof.

The hydrophobic degree of the filler (containing the inorganic fine particle aggregates) may be identified by the test of powder for its wettability with an aqueous solution of methanol. The test of the powder for its wettability is an approach involving spreading the powder in the aqueous solution of methanol at 25° C. to determine the concentration of methanol in the aqueous solution of methanol when the floating amount of the powder becomes 0 mass %. The filler hydrophobized to a larger extent tends to be less likely to precipitate in water, and to be more likely to precipitate therein as the methanol concentration increases. Therefore, a lower methanol concentration when the floating amount of the powder becomes 0 mass % means that the filler is hydrophobized to a larger extent.

The hydrophobic degree (the methanol concentration in the test of the powder for its wettability) of the filler (containing the inorganic fine particle aggregates) is typically 70 mass % or less, preferably 65 mass % or less, more preferably 60 mass % or less, still more preferably 55 mass % or less, particularly preferably 50 mass % or less, and is typically 30 mass % or more.

The content of the filler in the composite material is typically 30 parts by mass or more, preferably 40 parts by mass or more, more preferably 45 parts by mass or more, still more preferably 50 parts by mass or more, particularly preferably 55 parts by mass or more with respect to 100 parts by mass of the total of the polytetrafluoroethylene and the filler, and is typically 85 parts by mass or less, preferably 80 parts by mass or less, more preferably 75 parts by mass or less, still more preferably 70 parts by mass or less, particularly preferably 65 parts by mass or less with respect thereto. When the content falls within the range, the composite material can secure characteristics such as a satisfactory specific dielectric constant and a satisfactory expansion coefficient. The treatment liquid easily permeates the composite material having a high content of the filler, in particular, a high content of the inorganic fine particle aggregates, and hence the present disclosure can be more effectively utilized.

Although the composite material may contain a substance except the polytetrafluoroethylene and filler described in the foregoing, the total content of the polytetrafluoroethylene and the filler in the entirety of the composite material is typically 60 mass % or more, preferably 70 mass % or more, more preferably 80 mass % or more, still more preferably 90 mass % or more, particularly preferably 100 mass %.

Physical Properties and Characteristics of Composite Material

One feature of the composite material lies in that its porosity is 35% or more. The porosity of the composite material is preferably 40% or more, more preferably 45% or more, still more preferably 50% or more, particularly preferably 55% or more, and is typically 80% or less, preferably 70% or less. When the porosity falls within the range, the composite material can secure characteristics such as a satisfactory specific dielectric constant and a satisfactory expansion coefficient. In particular, the treatment liquid easily permeates the composite material having a high porosity, and hence the present disclosure can be more effectively utilized. The porosity of the composite material is a numerical value calculated by: measuring the volume of the composite material, the specific gravity and mass (blending mass) of the polytetrafluoroethylene (PTFE), and the specific gravity and mass (blending mass) of the inorganic fine particle aggregates; and substituting the measured values into the following equation.

[Porosity(%)]=([volume of composite material]−
[mass of PTFE/specific gravity of PTFE]−[mass
of inorganic fine particle aggregates/specific
gravity of inorganic fine particle aggregates])/
[volume of composite material]×100

One feature of the composite material lies in that its critical liquid-repellent tension is 34.0 mN/m or less. The critical liquid-repellent tension of the composite material is preferably 33.0 mN/m or less, more preferably 32.0 mN/m or less, still more preferably 31.0 mN/m or less, particularly preferably 30.0 mN/m or less, and the lower limit value thereof is typically 22.6 mN/m. When the critical liquid-repellent tension falls within the range, the occurrence of an appearance failure or changes in characteristics due to, for example, the treatment liquid to be used in the production of an electronic circuit board is particularly suppressed. The following wetting tension test is described in detail below.

[Wetting Tension Test]

A test object is immersed in each of test mixtures, which correspond to test mixtures described in JIS K 6768:1999 of Japan Industrial Standards, and which have wetting tensions at 23° C. of 22.6 mN/m, 25.4 mN/m, 27.3 mN/m, 30.0 mN/m, 31.0 mN/m, 32.0 mN/m, 33.0 mN/m, 34.0 mN/m, 35.0 mN/m, 36.0 mN/m, 37.0 mN/m, 38.0 mN/m, 39.0 mN/m, 40.0 mN/m, 41.0 mN/m, 42.0 mN/m, 43.0 mN/m, 44.0 mN/m, 45.0 mN/m, 46.0 mN/m, 48.0 mN/m, and 50.0 mN/m, at 25° C. for 1 minute to confirm whether or not each of the test mixtures permeates the test object, and a numerical value of a wetting tension of a test mixture having the smallest wetting tension out of the test mixtures that have not permeated the test object is determined to be a critical liquid-repellent tension of the test object.

The test mixtures corresponding to the test mixtures described in JIS K 6768:1999 of Japan Industrial Standards are, for example, "WETTING TENSION TEST MIXTURES" manufactured by Wako Pure Chemical Industries, Ltd. JIS K 6768:1999 is a standard after revision based on ISO 8296 of the International Organization for Standardization. The WETTING TENSION TEST MIXTURES come in 36 kinds having different wetting tensions (at 23° C.) (in the range of from 22.6 mN/m to 73.0 mN/m), and each contain a colorant, and hence whether or not the mixtures permeate the test object may be visually confirmed with ease. In addition, the fact that any one of the test mixtures does not permeate the test object may be judged from the fact that a mass change ratio after the immersion is less than 1% (priority is placed on the judgment based on the mass change ratio). A method of determining the critical liquid-repellent tension is described by way of a specific example. When a wetting tension test mixture having a wetting tension of 33.0 mN/m or less permeates the test object, and a wetting tension test mixture having a wetting tension of 34.0 mN/m or more does not permeate the test object, the numerical value of the wetting tension of the test mixture having the smallest wetting tension that has not permeated the test object is 34.0 mN/m, and hence the critical liquid-repellent tension of the test object is 34.0 mN/m. The immersion of the test object in a wetting tension test mixture that obviously fails to permeate the test object or a wetting tension test mixture that obviously permeates the test object may be appropriately omitted.

A method of controlling the critical liquid-repellent tension of the composite material to 34.0 mN/m or less is not particularly limited, and a known technology may be appropriately adopted; specific examples thereof include the following method (i) and method (ii):

(i) a method involving modifying the surface of the filler (containing the inorganic fine particle aggregates) with a surface modifier having a hydrophobic group (hereinafter sometimes abbreviated as "surface modifier"); and (ii) a method involving forming a fine structure on the surface of the filler.

The "method (i)", the "method (ii)", and the like are described in detail below.

Examples of the hydrophobic group of the surface modifier in the method (i) include a fluoro group (—F) and a hydrocarbon group (—$C_nH_{2n+1}$ (n=1 to 30)). Of those, a fluoro group that exhibits a liquid-repelling property not only on water but also on an oil agent is particularly preferred.

The surface modifier may be a surface modifier that chemically adsorbs (reacts) to the surface of the filler, or may be a surface modifier that physically adsorbs to the surface of the filler, and may be a low-molecular weight compound, or may be a polymer compound. The surface modifier that chemically adsorbs (reacts) to the surface of the filler typically has a reactive functional group that reacts with a surface functional group (e.g., a hydroxyl group (—OH)) of the filler, and examples of the reactive functional group include an alkoxysilyl group (—SiOR, where the number of carbon atoms of R is from 1 to 6), a chlorosilyl group (—SiCl), a bromosilyl group (—SiBr), and a hydrosilyl group (—SiH). A known method may be appropriately adopted as a method of modifying the surface of the filler with the surface modifier, and is, for example, a method involving bringing the filler and the surface modifier into contact with each other.

The number of kinds of the surface modifiers is not limited to one, and two or more kinds of the surface modifiers may be used in combination. For example, after a surface modifier serving as a low-molecular weight compound having a reactive functional group has been caused to react with the surface of the filler, a surface modifier that is a polymer compound having a hydrophobic group may be caused to physically adsorb onto the resultant. In the case where a material for the filler is silicon dioxide (silica) or the like, the filler may be dissolved (decomposed) when exposed to a basic aqueous solution. However, when the filler is modified as described above, its resistance to the basic aqueous solution can be improved.

The thermal decomposition temperature of the surface modifier is typically 250° C. or more, preferably 300° C. or more, more preferably 350° C. or more, still more preferably 360° C. or more, particularly preferably 370° C. or more. In the case where the thermal decomposition temperature falls within the range, the surface modifier can be suppressed from decomposing even when subjected to treatment such as high-temperature heating. The thermal decomposition temperature of the surface modifier is defined as the temperature at which the weight of the surface modifier reduces by 5% when its temperature is increased by a thermal weight reduction analysis method (TG-DTA) at 20° C./min.

Examples of a surface modifier that is a low-molecular weight compound having a fluoro group and a reactive functional group include compounds represented by the following formulae. The compounds represented by the following formulae are commercially available, and may each be appropriately obtained and utilized as a surface modifier.

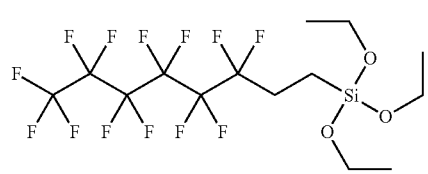

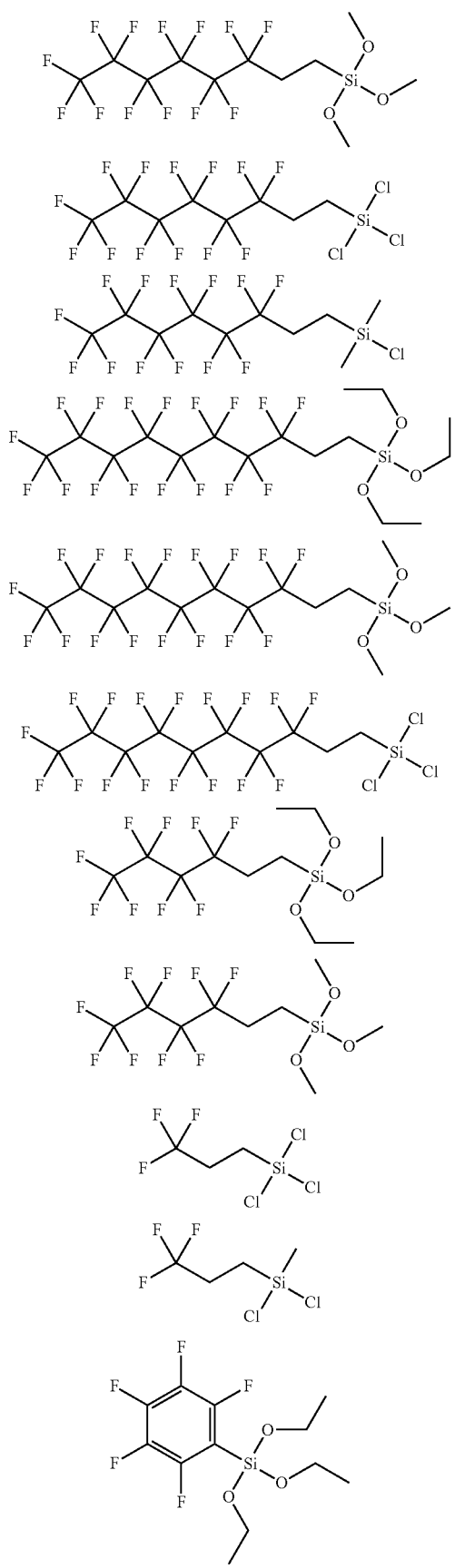

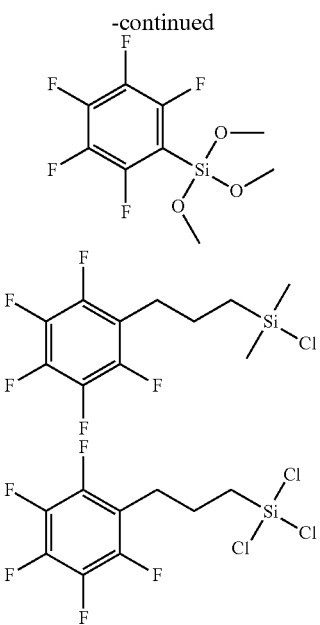

Examples of a surface modifier that is a polymer compound having a fluoro group include compounds represented by the following formulae. In the following formulae, n and m each represent a positive number of 1 or more.

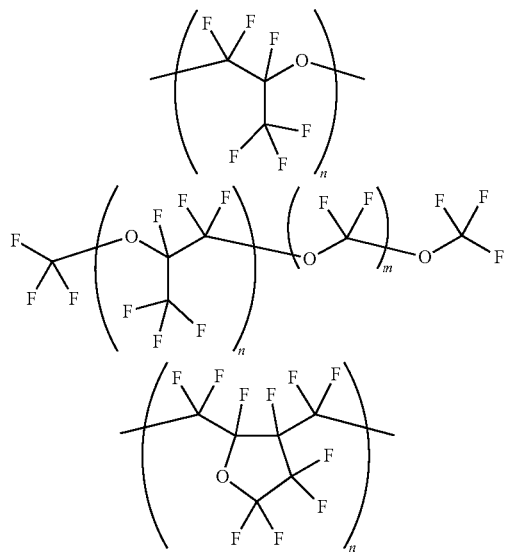

A solution commercially available as a surface modifier may be utilized, and a suitable example thereof is NOVEC (trademark) 2202 manufactured by 3M Company. It has been announced that the NOVEC (trademark) 2202 contains a polymer compound having a fluoro group and is blended with a "fluoroalkylsilane polymer". The use of the NOVEC (trademark) 2202 as a surface modifier has an advantage in that the critical liquid-repellent tension of the composite material is easily suppressed to a low level by a relatively simple operation.

The content of the surface modifier (organic matter content) in the filler is typically 0.1 mass % or more, preferably 1 mass % or more, more preferably 2 mass % or more, still more preferably 3 mass % or more, particularly preferably 4 mass % or more, and is typically 50 mass % or less, preferably 40 mass % or less, more preferably 30 mass % or less, still more preferably 25 mass % or less, particularly preferably 20 mass % or less. When the content falls within the range, the critical liquid-repellent tension of the composite material is easily suppressed to a low level, and hence the linear thermal expansion coefficient and loss tangent thereof are easily suppressed to low levels.

Examples of the fine structure in the method (ii) include a "glass surface fine structure" described in JP-A-2008-239429 and a "confetti-like projection" described in JP-A-2012-219004. When the fine structure is formed on the surface of the filler, an ultra-water-repelling and oil-repelling property is expressed, and hence the critical liquid-repellent tension of the composite material can be controlled to 34.0 mN/m or less. Examples of a method of forming the fine structure include methods described in those literatures.

The other physical properties, characteristics, and the like of the composite material are not particularly limited as long as its porosity is 35% or more, and its critical liquid-repellent tension is 34.0 mN/m or less. The specific dielectric constant, loss tangent, linear thermal expansion coefficient, and the like of the composite material are described below byway of their preferred numerical ranges.

The specific dielectric constant (frequency: 10 GHz) of the composite material is typically 2.0 or less, preferably 1.90 or less, more preferably 1.8 or less, still more preferably 1.75 or less, particularly preferably 1.70 or less, and is typically 1.55 or more. The specific dielectric constant of the composite material is the numerical value of a real part ($\varepsilon r'$) calculated by measuring a complex dielectric constant in accordance with a cavity resonator perturbation method (measurement frequency: 10 GHz).

The loss tangent (frequency: 10 GHz) of the composite material is typically 0.01 or less, preferably 0.008 or less, more preferably 0.006 or less, still more preferably 0.004 or less, particularly preferably 0.002 or less, and is typically 0.0005 or more. The loss tangent of the composite material is the ratio ($\varepsilon r''/\varepsilon r'$) of an imaginary part ($\varepsilon r''$) to the real part ($\varepsilon r'$) calculated by measuring the complex dielectric constant in accordance with the cavity resonator perturbation method (measurement frequency: 10 GHz).

The linear thermal expansion coefficient of the composite material is typically 70 ppm/K or less, preferably 60 ppm/K or less, more preferably 55 ppm/K or less, still more preferably 50 ppm/K or less, particularly preferably 45 ppm/K or less, and is typically 10 ppm/K or more. The linear thermal expansion efficient of the composite material is the numerical value of an average linear thermal expansion coefficient in the range of from −50° C. to 200° C. obtained by a thermal mechanical analysis (TMA) method. Specifically, the composite material having a width of 4 mm and a length of 20 mm is fixed in its lengthwise direction, and a load of 2 g is applied thereto. The temperature of the material is increased from room temperature (23° C.) to 200° C. at a rate of temperature increase of 10° C./min, and is held at 200° C. for 30 minutes so that the residual stress of the material may be removed. Next, the temperature is cooled to −50° C. at 10° C./min, and is held at −50° C. for 15 minutes. After that, the temperature is increased to 200° C. at 2° C./min. An average linear thermal expansion coefficient in the range of from −50° C. to 200° C. in the second temperature increase process was defined as the linear thermal expansion coefficient.

Form and Structure of Composite Material

The composite material is of a plate shape, and the thickness of the composite material is typically 0.01 mm or more, preferably 0.02 mm or more, more preferably 0.05 mm or more, still more preferably 0.07 mm or more, particularly preferably 0.08 mm or more, and is typically 2.0 mm or less, preferably 1.0 mm or less, more preferably 0.5 mm or less, still more preferably 0.2 mm or less, particularly preferably 0.15 mm or less.

The composite material may include any other layer on one surface, or each of both surfaces, thereof. Examples of the other layer include a metal layer and a resin layer. The metal layer is utilized in a wiring or the like when the composite material is used as, for example, an electronic circuit board. The resin layer may be used for various purposes; for example, when the composite material, the resin layer, and the metal layer are laminated in the stated order, the resin layer is utilized as an adhesion layer.

In general, examples of metallic species of the metal layer when the layer is used as a wiring include gold (Au), silver (Ag), platinum (Pt), copper (Cu), aluminum (Al), and alloys containing these metallic species.

The thickness of the metal layer when the layer is used as a wiring is typically 5 μm or more, preferably 10 μm or more, more preferably 15 μm or more, and is typically 50 μm or less, preferably 45 μm or less, more preferably 40 μm or less.

In general, the kind of the resin layer when the layer is used as an adhesion layer is a thermoplastic resin, preferably a fluorine-based resin, more preferably a perfluoroalkoxyalkane (PFA, melting point: 310° C.), a tetrafluoroethylene-hexafluoropropylene copolymer (FEP, melting point: 260° C.), polychlorotrifluoroethylene (PCTEF, melting point: 220° C.), a tetrafluoroethylene-ethylene copolymer (ETFE, melting point: 270° C.), a chlorotrifluoroethylene-ethylene copolymer (ECTFE, melting point: 270° C.), and polyvinylidene fluoride (PVDF, melting point: 151° C. to 178° C.), each of which has a melting point lower than that of polytetrafluoroethylene (PTFE, melting point: 327° C.), particularly preferably PFA.

Applications of Composite Material

Although the applications of the composite material are not particularly limited, preferred examples thereof include electronic circuit boards, more preferred examples thereof include the wiring boards of the modules of a cellular phone, a computer, an antenna, and the like, and particularly preferred examples thereof include the wiring boards of millimeter-wave antennas (wiring boards for high frequencies). In the applications of the wiring boards of the millimeter-wave antennas, the characteristics of the composite material, such as a specific dielectric constant, can be effectively utilized.

Method of Producing Composite Material

The composite material is a plate-like material including the polytetrafluoroethylene and the filler, but a method of producing the composite material is not particularly limited, and the material may be produced by appropriately adopting a known finding. A method of producing the composite material including the following filler-preparing step, mixing step, forming step, and rolling step (hereinafter sometimes abbreviated as "method of producing the composite material") is particularly preferred:
   a filler-preparing step of preparing a filler containing porous inorganic fine particle aggregates each formed by the aggregation of inorganic fine particles having an average primary particle diameter of from 5 nm to 200 nm (hereinafter sometimes abbreviated as "filler-preparing step");
   a mixing step of mixing polytetrafluoroethylene and the filler to provide a precursor composition (hereinafter sometimes abbreviated as "mixing step");
   a forming step of forming the precursor composition to provide a product to be rolled that can be rolled (hereinafter sometimes abbreviated as "forming step"); and
   a rolling step of rolling the product to be rolled to provide a rolled product (hereinafter sometimes abbreviated as "rolling step").

The "filler-preparing step", the "mixing step", the "forming step", the "rolling step", and the like are described in detail below.

The filler-preparing step is a step of preparing the filler containing the inorganic fine particle aggregates, but the filler (containing the inorganic fine particle aggregates) may be obtained from the market, or may be produced by oneself; provided that the filler-preparing step preferably includes performing at least one selected from the group consisting of the method (i) and the method (ii) on the filler in order that the critical liquid-repellent tension of the composite material may be controlled to 34.0 mN/m or less.

The mixing step is a step of mixing the polytetrafluoroethylene and the filler to provide the precursor composition, and the polytetrafluoroethylene is preferably a fine powder product or a granulated product.

The average particle diameter of the fine powder product or granulated product of the polytetrafluoroethylene is preferably larger than the average primary particle diameter of the inorganic fine particle aggregates, that is, from 5 nm to 200 nm, and is particularly preferably more than 0.2 μm and 650 μm or less. The average particle diameter of the fine powder product or the granulated product may be determined in conformity with JIS K 6891-5.4.

In the mixing step, in addition to the polytetrafluoroethylene and the filler, a solvent and a volatile additive are preferably added before the mixing. The solvent has an action of bringing the precursor composition into a paste state to enable its uniform dispersion, and the volatile additive has the following action: the additive is finally removed by volatilization to increase the porosity of the composite material.

Examples of the solvent include water and lower alcohols, such as methanol, ethanol, isopropanol, and butanol.

The volatile additive means a compound that has a boiling point of from 30° C. to 300° C. and is a liquid at room temperature, and the boiling point of the volatile additive is preferably 50° C. or more, more preferably 100° C. or more, still more preferably 200° C. or more, and is preferably 280° C. or less, more preferably 260° C. or less, still more preferably 240° C. or less.

Examples of the kind of the volatile additive include a hydrocarbon, an ether, an ester, and an alcohol each having low reactivity, and an aliphatic saturated hydrocarbon is preferred. Specific examples thereof include hexane (boiling point: 69° C.), heptane (boiling point: 98° C.), octane (boiling point: 126° C.), nonane (boiling point: 151° C.), decane (boiling point: 174° C.), undecane (boiling point: 196° C.), dodecane (boiling point: 215° C.), tridecane (boiling point: 234° C.), and tetradecane (boiling point: 254° C.), and dodecane is particularly preferred.

The addition amount of the volatile additive is typically 1 part by mass or more, preferably 5 parts by mass or more, more preferably 10 parts by mass or more, still more preferably 20 parts by mass or more, particularly preferably 30 parts by mass or more with respect to 100 parts by mass of the total of the polytetrafluoroethylene and the filler, and is typically 200 parts by mass or less, preferably 150 parts by mass or less, more preferably 130 parts by mass or less, still more preferably 110 parts by mass or less, particularly preferably 100 parts by mass or less with respect thereto. When the addition amount falls within the range, the composite material can secure a satisfactory porosity.

The forming step is a step of forming the precursor composition to provide the product to be rolled that can be rolled, and a forming machine to be used in the forming step is, for example, an FT die, a Press machine, an extrusion molding machine, or a calender roll. Of those, an FT die is particularly preferred.

The rolling step is a step of rolling the product to be rolled to provide the rolled product. The step is preferably "multi-stage rolling" in which the following operation is repeated a plurality of times: the resultant rolled products are laminated, and the laminate is rolled as a product to be rolled. The step is particularly preferably "directionally different multi-stage rolling" in which the product to be rolled is rolled in a direction different from the previous rolling direction. The directionally different multi-stage rolling is, for example, the repetition of the following operation: a product to be rolled is obtained by laminating rolled products so that the rolled products may face the same rolling direction, and the product to be rolled is rolled in a rolling direction rotated from the previous rolling direction by 90°.

The number of the rolled products to be laminated in the multi-stage rolling is typically 2 or more, preferably 3 or more, more preferably 4 or more, still more preferably 10 or more, particularly preferably 30 or more, and is typically 2,000 or less, preferably 1,000 or less, more preferably 500 or less, still more preferably 200 or less, particularly preferably 100 or less.

The rolling ratio in the rolling step is typically 10 or more, preferably 20 or more, more preferably 40 or more, still more preferably 50 or more, particularly preferably 100 or more, and is typically 20,000 or less, preferably 10,000 or less, more preferably 5,000 or less, still more preferably 2,000 or less, particularly preferably 1,000 or less.

A rolling ratio λ is determined from the equation "λ=L2/L1" by using the length (L1) of a raw sheet and the length (L2) thereof after its rolling.

An apparatus to be used in the rolling step is, for example, a press machine, an extrusion molding machine, or a rolling roll (e.g., a calender roll).

The method of producing the composite material may include any other step, and specific examples thereof include the following steps:
- an additive-removing step of removing the volatile additive from the rolled product (hereinafter sometimes abbreviated as "additive-removing step");
- a heating and pressurizing step of heating and pressurizing the rolled product (hereinafter sometimes abbreviated as "heating and pressurizing step");
- an other layer-forming step of forming at least one selected from the group consisting of a metal layer and a resin layer on one surface, or each of both surfaces, of the rolled product (hereinafter sometimes abbreviated as "other layer-forming step"); and
- a patterning step of subjecting the metal layer to patterning treatment (hereinafter sometimes abbreviated as "patterning step").

The "additive-removing step", the "heating and pressurizing step", the "other layer-forming step", the "patterning step", and the like are described in detail below.

The additive-removing step is a step of removing the volatile additive from the rolled product, and a method therefor is typically, for example, a method involving heating the rolled product in a heating furnace that may be used in drying. A heating condition may be appropriately selected in accordance with, for example, the boiling point of the volatile additive.

The heating and pressurizing step is a step of heating and pressurizing the rolled product, and a method therefor is typically, for example, a method involving heating and pressurizing the rolled product with a press machine or the like. A heating temperature is typically from 300° C. to 500° C., and pressurization conditions are typically as follows: the rolled product is pressurized at from 0.2 MPa to 30 MPa for from 5 minutes to 60 minutes.

The other layer-forming step is a step of forming at least one selected from the group consisting of the resin layer and the metal layer on one surface, or each of both surfaces, of the rolled product, and a method of forming the metal layer is, for example, sputtering, plating, the pressure bonding of a metal foil, or a lamination method. A method of forming the resin layer is, for example, a method involving sandwiching a resin film between the composite material and a metal foil, and subjecting the resultant to pressure bonding.

The patterning step is a step of subjecting the metal layer to the patterning treatment, and a method for the patterning treatment is, for example, an additive method involving using a photoresist or the like, or a subtractive method based on etching.

EXAMPLES

Next, the composite material of the present disclosure is specifically described by way of Examples, but the present disclosure is not limited to these Examples.

Example 1

Hydrophilic fumed silica (manufactured by Nippon Aerosil Co., Ltd., product number: "AEROSIL 50", BET specific surface area: 50±15 m²/g, apparent specific gravity: 50 g/L, average primary particle diameter: 40 nm, average particle diameter of secondary aggregate products: 0.2 μm) was used as inorganic fine particle aggregates, and triethoxy-1H, 1H, 2H, 2H-tridecafluoro-n-octylsilane (manufactured by Tokyo Chemical Industry Co., Ltd., product number: "T1770") represented by the following formula was used as a surface modifier. The inorganic fine particle aggregates were modified with the surface modifier.

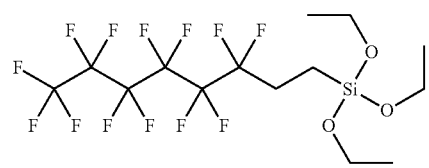 [SMILES: CCO[Si](CCC(F)(F)C(F)(F)C(F)(F)C(F)(F)C(F)(F)C(F)(F)F)(OCC)OCC]

Specifically, 40.8 g of the surface modifier, 22.1 g of acetic acid, 43.2 g of pure water, and 80 g of the inorganic fine particle aggregates were added to 832.9 g of isopropanol, and the mixture was stirred for 24 hours to provide a dispersion of the inorganic fine particle aggregates. Next, the dispersion was heated at 100° C. for 1 hour, and was further heated at 200° C. for 2 hours to provide surface-modified inorganic fine particle aggregates. The hydrophobic degree (test of powder for its wettability) of the inorganic fine particle aggregates was 68 mass %.

Next, polytetrafluoroethylene, the inorganic fine particle aggregates, and a volatile additive were mixed with a V-type mixer. Specifically, the polytetrafluoroethylene (manufactured by Daikin Industries, Ltd., product number: "POLYFLON PTFE F-104", average particle diameter: 550 µm) was added in consideration of its solid content so that a mass ratio between the polytetrafluoroethylene and the resultant inorganic fine particle aggregates became 40:60, and dodecane was added as the volatile additive so that its amount became 50 parts by mass with respect to 100 parts by mass of the total of the polytetrafluoroethylene and the inorganic fine particle aggregates. The materials were mixed at a number of revolutions of 10 rpm and a temperature of 24° C. for 5 minutes to provide a paste.

The paste was passed through a pair of rolling rolls to provide an elliptical base sheet (sheet-like formed body) having a thickness of 3 mm, a width of from 10 mm to 50 mm, and a length of 150 mm, and a plurality of the base sheets were produced. Next, two of the base sheets were laminated while their rolling directions were aligned with each other, and the laminate was passed through the rolling rolls in the previous rolling direction to be rolled. Thus, a first rolled laminated sheet was produced. A plurality of the first rolled laminated sheets were produced. Next, two of the first rolled laminated sheets were laminated while their rolling directions were aligned with each other. The rolled laminate sheets were rotated from the previous rolling direction by 90° while their sheet surfaces were kept parallel to each other, and the sheets were passed through the rolling rolls to be rolled. Thus, a second rolled laminated sheet was produced. A plurality of the second rolled laminated sheets were produced. Further, two of the second rolled laminated sheets were rolled in the same manner as in the method of producing the second rolled laminated sheet to produce a third rolled laminated sheet. The step of laminating and rolling the sheets as described above was repeated a total of five times counting from the lamination and rolling of the base sheets, and then the resultant was rolled a plurality of times while a gap between the rolling rolls was narrowed by 0.5 mm each time. Thus, a rolled laminated sheet having a thickness of about 0.18 mm was obtained (number of layers forming the sheet: 32).

The volatile additive was removed by heating the resultant rolled laminated sheet at 150° C. for 20 minutes. The resultant sheet was subjected to pressure forming at 380° C. and 1 MPa for 5 minutes to produce a plate-like composite material having a thickness of about 0.15 mm.

The porosity, hydrophobic degree, critical liquid-repellent tension, specific dielectric constant and loss tangent, and linear thermal expansion coefficient of the resultant composite material were measured as described below, and a mass change ratio when the material was immersed in a cleaner-conditioner solution was measured. The hydrophobic degree was measured for a filler. The results are shown in Table 1.

Porosity

The porosity was calculated by: measuring the volume of the composite material, the specific gravity and mass (blending mass) of the polytetrafluoroethylene (PTFE), and the specific gravity and mass (blending mass) of the inorganic fine particle aggregates; and substituting the measured values into the following equation.

$$[\text{Porosity}(\%)] = ([\text{volume of composite material}] - [\text{mass of PTFE/specific gravity of PTFE}] - [\text{mass of inorganic fine particle aggregates/specific gravity of inorganic fine particle aggregates}]) / [\text{volume of composite material}] \times 100$$

Hydrophobic Degree

The hydrophobic degree of the filler was calculated by: spreading the powder of the filler in an aqueous solution of methanol at 25° C.; and determining the concentration of methanol in the aqueous solution of methanol when the floating amount of the powder became 0 mass %.

Critical Liquid-Repellent Tension

The composite material was immersed in "WETTING TENSION TEST MIXTURE" manufactured by Wako Pure Chemical Industries, Ltd. at room temperature for 1 minute, and was then washed with distilled water, followed by visual judgment of whether or not the wetting tension test mixture permeated the composite material. WETTING TENSION TEST MIXTURES Nos. 22.6 to 50.0 were used, and the numerical value of the surface tension of the test mixture having the lowest surface tension out of the wetting tension test mixtures that had not been observed to permeate the material was adopted as the result of the critical liquid-repellent tension of the material.

Specific Dielectric Constant and Loss Tangent

A complex dielectric constant was measured by a cavity resonator perturbation method at a measurement frequency of 10 GHz, and its real part ($\varepsilon r'$) was adopted as a specific dielectric constant. In addition, a loss tangent was determined from the ratio ($\varepsilon r''/\varepsilon r'$) of an imaginary part ($\varepsilon r''$) to the real part.

With the use of a specific dielectric constant-measuring apparatus ("Network Analyzer N5230C" manufactured by Agilent Technologies, and "Cavity Resonator 10 GHz" manufactured by Kanto Electronic Application and Development Inc.), a strip-shaped sample (sample size: 2 mm in width×70 mm in length) was cut out of each sheet and subjected to the measurement.

Linear Thermal Expansion Coefficient

An average linear thermal expansion coefficient in a sheet plane direction in the range of from −50° C. to 200° C. was determined as a linear thermal expansion coefficient (ppm/K) by a TMA method with a thermal mechanical analyzer (manufactured by BRUKER AXS, "TMA4000SA"). Specifically, the composite material having a width of 4 mm and a length of 20 mm is fixed in its lengthwise direction, and a load of 2 g is applied thereto. The temperature of the material is increased from room temperature to 200° C. at a rate of temperature increase of 10° C./min, and is held at 200° C. for 30 minutes so that the residual stress of the material may be removed. Next, the temperature is cooled to −50° C. at 10° C./min, and is held at −50° C. for 15 minutes. After that, the temperature is increased to 200° C. at 2° C./min. An average linear thermal expansion coefficient in the range of from −50° C. to 200° C. in the second temperature increase process was defined as the linear thermal expansion coefficient.

Mass Change Ratio by Cleaner-Conditioner
Solution (CC Solution) Immersion Test

A cleaner-conditioner solution containing a surfactant for electroless plating pretreatment (manufactured by Rohm and Haas Electronic Materials, CIRCUPOSIT (trademark) CONDITIONER-NEUTRALIZER 3320), which was a solution having relatively high permeability to be used in electronic circuit processing, was used to measure the mass change ratio of the resultant composite material by its immersion in the solution. A specific procedure is as follows: the mass of the composite material is measured in advance; next, the material is immersed in a mixed solution containing the cleaner-conditioner solution and ion-exchanged water (at a volume ratio of 10:90) at 45° C. for 5 minutes; and the material is rinsed with ion-exchanged water, and moisture on its surface is wiped off, followed by the measurement of its mass to calculate the mass change ratio.

Example 2

A composite material was produced by the same method as that of Example 1 except that dodecane was added so that its amount became 45 parts by mass with respect to 100 parts by mass of the total of the polytetrafluoroethylene and the inorganic fine particle aggregates. The results are shown in Table 1.

Example 3

A composite material was produced by the same method as that of Example 1 except that dodecane was added so that its amount became 40 parts by mass with respect to 100 parts by mass of the total of the polytetrafluoroethylene and the inorganic fine particle aggregates. The results are shown in Table 1.

Example 4

A composite material was produced by the same method as that of Example 3 except that: the surface modifier was changed to NOVEC (trademark) 2202 manufactured by 3M Company; and the method for the surface modification was changed as described below. The surface modification was performed by mixing and dispersing the inorganic fine particle aggregates so that the solid content of the NOVEC (trademark) 2202 became 25 parts by mass with respect to 100 parts by mass of the inorganic fine particle aggregates. The results are shown in Table 1.

Example 5

A composite material was produced by the same method as that of Example 4 except that the inorganic fine particle aggregates were changed to hydrophobic fumed silica treated with an aminosilane (($C_2H_5O)_3SiC_3H_6NH_2$) and hexamethyldisilazane (HMDS) (manufactured by Nippon Aerosil Co., Ltd., product number: "AEROSIL NA50H", BET specific surface area: 40±10 m$^2$/g, apparent specific gravity: 50 g/L). The results are shown in Table 1.

Example 6

A composite material was produced by the same method as that of Example 2 except that the inorganic fine particle aggregates were changed to hydrophobic fumed silica treated with an aminosilane (($C_2H_5O)_3SiC_3H_6NH_2$) and hexamethyldisilazane (HMDS) (manufactured by Nippon Aerosil Co., Ltd., product number: "AEROSIL NA50H", BET specific surface area: 40±10 m$^2$/g, apparent specific gravity: 50 g/L). The results are shown in Table 2.

Comparative Example 1

A composite material was produced by the same method as that of Example 1 except that: the inorganic fine particle aggregates were changed to hydrophobic fumed silica treated with dimethylpolysiloxane (silicone oil) (manufactured by Nippon Aerosil Co., Ltd., product number: "AEROSIL NY50", BET specific surface area: 30±10 m$^2$/g, apparent specific gravity: 50 g/L, average particle diameter of primary particles: 40 nm); and its surface was not modified with the surface modifier (triethoxy-1H, 1H, 2H, 2H-tridecafluoro-n-octylsilane). The results are shown in Table 2.

Comparative Example 2

A composite material was produced by the same method as that of Example 1 except that: the inorganic fine particle aggregates were changed to hydrophobic fumed silica treated with hexamethyldisilazane (HMDS) (manufactured by Nippon Aerosil Co., Ltd., product number: "AEROSIL NAX50", BET specific surface area: 40±10 m$^2$/g, apparent specific gravity: 40 g/L, average particle diameter of primary particles: 40 nm); and its surface was not modified with the surface modifier (triethoxy-1H,1H,2H,2H-tridecafluoro-n-octylsilane). The results are shown in Table 2.

Comparative Example 3

A composite material was produced by the same method as that of Example 1 except that: the inorganic fine particle aggregates were changed to hydrophobic fumed silica treated with dimethylpolysiloxane (silicone oil) (manufactured by Nippon Aerosil Co., Ltd., product number: "AEROSIL RY200S", BET specific surface area: 80±15 m$^2$/g, apparent specific gravity: 50 g/L, average particle diameter of primary particles: 10 nm); and its surface was not modified with the surface modifier (triethoxy-1H,1H,2H, 2H-tridecafluoro-n-octylsilane). The results are shown in Table 2.

Comparative Example 4

A composite material was produced by the same method as that of Example 2 except that: the inorganic fine particle aggregates were changed to hydrophobic fumed silica treated with hexamethyldisilazane (HMDS) (manufactured by Nippon Aerosil Co., Ltd., product number: "AEROSIL RX300", BET specific surface area: 200±20 m$^2$/g, apparent specific gravity: 40 g/L, average particle diameter of primary particles: 8 nm); and its surface was not modified with the surface modifier (triethoxy-1H,1H,2H,2H-tridecafluoro-n-octylsilane). The results are shown in Table 2.

Comparative Example 5

A composite material was produced by the same method as that of Example 3 except that: the inorganic fine particle aggregates were changed to silica aerogel; and its surface was not modified with the surface modifier. The results are shown in Table 3.

Comparative Example 6

A composite material was produced by the same method as that of Example 1 except that: the inorganic fine particle aggregates were changed to hollow silica (manufactured by 3M Company, iM16K); its surface was not modified with the surface modifier; and dodecane was added so that its amount became 55 parts by mass with respect to 100 parts by mass of the total of the polytetrafluoroethylene and the hollow silica. The results are shown in Table 3.

TABLE 1

|  |  | Example 1 | Example 2 |
|---|---|---|---|
| Filler | Kind | AEROSIL50 Porous inorganic fine particle aggregates | AEROSIL50 Porous inorganic fine particle aggregates |
|  | BET specific surface area (m²/g) | 50 ± 15 | 50 ± 15 |
|  | Apparent specific gravity (g/L) | 50 | 50 |
| Kind of surface modifier |  | F₃C(CF₂)₅CH₂CH₂Si(OC₂H₅)₃ | F₃C(CF₂)₅CH₂CH₂Si(OC₂H₅)₃ |
| Formulation (mass ratio) | PTFE | 40 | 40 |
|  | Filler | 60 | 60 |
|  | Volative additive | 50 | 45 |
| Physical property | Porosity (%) | 55 | 49 |
|  | Hydrophobic degree (mass %) | 68 | 68 |
|  | Critical liquid-repellent tension (mN/m) | 27.3 | 27.3 |
| Characteristic evaluation | Specific dielectric constant | 1.7 | 1.75 |
|  | Loss tangent | 0.0026 | 0.0032 |
|  | Linear thermal expansion coefficient (ppm/K) | 47 | 45 |
|  | Mass change ratio by CC solution immersion test | <1% | <1% |

|  |  | Example 3 | Example 4 | Example 5 |
|---|---|---|---|---|
| Filler | Kind | AEROSIL50 Porous inorganic fine particle aggregates | AEROSIL50 Porous inorganic fine particle aggregates | AEROSIL NA50H Porous inorganic fine particle aggregates (treated with (C₂H₅O)₃SiC₃H₆NH₂ and HMDS) |
|  | BET specific surface area (m²/g) | 50 ± 15 | 50 ± 15 | 40 ± 10 |
|  | Apparent specific gravity (g/L) | 50 | 50 | 50 |
| Kind of surface modifier |  | F₃C(CF₂)₅CH₂CH₂Si(OC₂H₅)₃ | Novec™ 2202 | (C₂H₅O)₃SiC₃H₆NH₂ / HMDS / Novec™ 2202 |
| Formulation (mass ratio) | PTFE | 40 | 40 | 40 |
|  | Filler | 60 | 60 | 60 |
|  | Volative additive | 40 | 40 | 40 |
| Physical property | Porosity (%) | 44 | 56 | 50 |
|  | Hydrophobic degree (mass %) | 68 | 66 | 69 |
|  | Critical liquid-repellent tension (mN/m) | 27.3 | 27.3 | 25.4 |

TABLE 1-continued

| Characteristic evaluation | Specific dielectric constant | 1.81 | 1.64 | 1.74 |
|---|---|---|---|---|
| | Loss tangent | 0.0031 | 0.0019 | 0.0012 |
| | Linear thermal expansion coefficient (ppm/K) | 41 | 18 | 23 |
| | Mass change ratio by CC solution immersion test | <1% | <1% | <1% |

TABLE 2

| | | Example 6 | Comparative Example 1 | Comparative Example 2 | Comparative Example 3 | Comparative Example 4 |
|---|---|---|---|---|---|---|
| Filler | Kind | AEROSIL NA50H Porous inorganic fine particle aggregates (treated with $(C_2H_5O)_3SiC_3H_6NH_2$ and HMDS) | AEROSIL NY50 Porous inorganic fine particle aggregates (treated with silicone oil) | AEROSIL NAX50 Porous inorganic fine particle aggregates (treated with HDMS) | AEROSIL RY200S Porous inorganic fine particle aggregates (treated with silicone oil) | AEROSIL RX300 Porous inorganic fine particle aggregates (treated with HDMS) |
| | BET specific surface area (m²/g) | 40 ± 10 | 30 ± 10 | 40 ± 10 | 80 ± 15 | 200 ± 20 |
| | Apparent specific gravity (g/L) | 50 | 50 | 40 | 50 | 40 |
| | Kind of surface modifier | 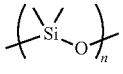 | 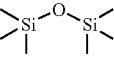 | 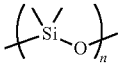 | 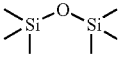 | 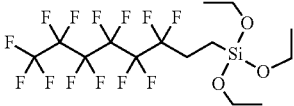 |
| Formulation (mass ratio) | PTFE | 40 | 40 | 40 | 40 | 40 |
| | Filler | 60 | 60 | 60 | 60 | 60 |
| | Volatile additive | 45 | 50 | 50 | 50 | 45 |
| Physical property | Porosity (%) | 52 | 57 | 61 | 57 | 63 |
| | Hydrophobic degree (mass %) | 60 | 52 | 47 | — | — |
| | Critical liquid-repellent tension (mN/m) | 34.0 | 38.0 | 46.0 | 40.0 | 46.0 |
| Characteristic evaluation | Specific dielectric constant | 1.83 | 1.75 | 1.68 | 1.77 | 1.55 |
| | Loss tangent | 0.0049 | 0.0018 | 0.0011 | 0.0036 | 0.007 |
| | Linear thermal expansion coefficient (ppm/K) | — | 31 | 25 | 38 | 35 |
| | Mass change ratio by CC solution immersion test | <1% | 12.3% | 27.9% | 15.3% | 22.3% |

TABLE 3

| | | Comparative Example 5 | Comparative Example 6 |
|---|---|---|---|
| Filler | Kind | Silica aerogel | 1M 16K Hollow silica |
| | BET specific surface area (m²/g) | — | — |
| | Apparent specific gravity (g/L) | — | — |
| | Kind of surface modifier | — | — |
| Formulation (mass ratio) | PTFE | 40 | 40 |
| | Filler | 60 | 60 |
| | Volatile additive | 40 | 55 |
| Physical property | Porosity (%) | 67 | 43 |
| | Hydrophobic degree (mass %) | — | — |
| | Critical liquid-repellent tension (mN/m) | >50.0 | 34.0 |
| Characteristic evaluation | Specific dielectric constant | 1.69 | 1.63 |
| | Loss tangent | 0.0345 | 0.0068 |
| | Linear thermal expansion coefficient (ppm/K) | — | 65 |
| | Mass change ratio by CC solution immersion test | 3.1% | <1% |

It was found that Examples were each a composite material that showed a low specific dielectric constant, and that hardly caused an appearance failure or changes in characteristics when exposed to the CC solution, and hence Examples were each suitable for an electronic circuit board. In contrast, the mass change ratio of each of Comparative Examples 1 to 5 by the CC solution immersion test was large, and Comparative Example 6 had a high linear thermal expansion coefficient, and hence Comparative Examples 1 to 6 were not suitable for practical use.

Although specific modes of the present disclosure have been described in Examples above, Examples are for illustrative purposes only and are not to be construed as limitative. It is intended that various modifications apparent to a person skilled in the art fall within the scope of the present disclosure.

The composite material of the present disclosure is suitable for the wiring boards of the modules of a cellular phone, a computer, an antenna, and the like, in particular, the wiring boards of millimeter-wave antennas (wiring boards for high frequencies).

The invention claimed is:

1. A plate-like composite product, comprising: polytetrafluoroethylene; and a filler, wherein the polytetrafluoroethylene is fibrillated, wherein the filler contains porous inorganic fine particle aggregates each formed by aggregation of inorganic fine particles having an average primary particle diameter of from 5 nm to 200 nm, wherein the composite material has a porosity of 35% or more, wherein the composite material has a critical liquid-repellent tension determined by a wetting tension test of 34.0 mN/m or less, wherein, in the wetting tension test, a test object is immersed in each of test mixtures, which correspond to test mixtures described in JIS K 6768:1999 of Japan Industrial Standards, and which have wetting tensions at 23° C. of 22.6 mN/m, 25.4 mN/m, 27.3 mN/m, 30.0 mN/m, 31.0 mN/m, 32.0 mN/m, 33.0 mN/m, 34.0 mN/m, 35.0 mN/m, 36.0 mN/m, 37.0 mN/m, 38.0 mN/m, 39.0 mN/m, 40.0 mN/m, 41.0 mN/m, 42.0 mN/m, 43.0 mN/m, 44.0 mN/m, 45.0 mN/m, 46.0 mN/m, 48.0 mN/m, and 50.0 mN/m, at 25° C. for 1 minute to confirm whether or not each of the test mixtures permeates the test object, and a numerical value of a wetting tension of a test mixture having the smallest wetting tension out of the test mixtures that have not permeated the test object is determined to be a critical liquid-repellent tension of the test object, and wherein a surface of the filler is modified by a surface modifier having a hydrophobic group or by forming a fine structure on the surface of the filler.

2. The plate-like composite product according to claim 1, wherein the filler has a BET specific surface area of from 30 m²/g to 240 m²/g.

3. The plate-like composite product according to claim 1, wherein a content of the filler is 55 parts by mass or more with respect to 100 parts by mass of a total of the polytetrafluoroethylene and the filler.

4. The plate-like composite product according to claim 1, wherein the filler has an apparent specific gravity of 100 g/L or less.

5. The plate-like composite product according to claim 1, wherein the composite material is configured to be an electronic circuit board.

6. An electronic circuit board comprising the plate-like composite product of claim 1.

* * * * *